United States Patent [19]

Faillon et al.

[11] Patent Number: 4,591,799
[45] Date of Patent: May 27, 1986

[54] HIGH POWER KLYSTRON AMPLIFIER FOR SUPPLYING A VARIABLE LOAD

[75] Inventors: Georges Faillon, Meudon; Bernard Epsztein, Sceaux, both of France

[73] Assignee: Thomson-CSF, Paris, France

[21] Appl. No.: 604,816

[22] Filed: Apr. 27, 1984

[30] Foreign Application Priority Data

May 3, 1983 [FR] France ................. 83 07362

[51] Int. Cl.⁴ ............................................... H03F 3/56
[52] U.S. Cl. ......................................... 330/45; 330/145
[58] Field of Search ........................... 330/44–46, 330/49, 145, 284; 331/83

[56] References Cited

U.S. PATENT DOCUMENTS

| | | | |
|---|---|---|---|
| 3,461,401 | 8/1969 | Williams | 331/83 |
| 3,473,125 | 10/1969 | Babillon | 455/108 |
| 4,016,516 | 4/1977 | Sauter et al. | 333/81 R |
| 4,019,150 | 4/1977 | Lurey et al. | 330/2 X |
| 4,485,349 | 11/1984 | Siegel et al. | 330/45 X |

FOREIGN PATENT DOCUMENTS

| | | |
|---|---|---|
| 1766741 | 8/1971 | Fed. Rep. of Germany . |
| 1205719 | 2/1960 | France . |
| 2280211 | 2/1976 | France . |
| 988369 | 4/1965 | United Kingdom . |

OTHER PUBLICATIONS

IRE Transactions on Communications Systems, vol. CS-10, No. 1, Mar. 1962, pp. 142–145, New York, US V. C. Chewey et al.: "Beam-Controlled . . . ".

Primary Examiner—James B. Mullins
Attorney, Agent, or Firm—Roland Plottel

[57] ABSTRACT

A klystron is provided for supplying power with optimum efficiency across a variable impedance load. To attain this result, the field in the output cavity of a klystron is detected by a probe. This field supplies the image of the voltage at the terminals of the interaction gap. The signal supplied by the probe is used for adjusting the amplitude of the ultra-high frequency voltage applied to the input cavity so that the voltage of the terminals of the interaction gap remains less than the tolerable maximum whatever the ratio of standing waves reflected back by the output device.

5 Claims, 4 Drawing Figures

HIGH POWER KLYSTRON AMPLIFIER FOR SUPPLYING A VARIABLE LOAD

BACKGROUND OF THE INVENTION

1. Field of the Invention

The present invention relates to the field of high power ultra-high frequency signal generators. It relates more particularly to an amplifying klystron able to deliver a very high ultra-high frequency power and adapted to feed a variable impedance load.

2. Description of the Prior Art

For a better understanding of the problem and the solutions of the prior art, there will first of all be described, with reference to FIG. 1, the schematical structure and the operation of an amplifying klystron and, with reference to FIG. 2, the performances which may be reached with such a device and the existing limitations in the case where it is called on to operate across a variable load.

FIG. 1 shows very schematically the conventional structure of an amplifying klystron. This klystron tube comprises, inside a vacuum enclosure not shown, an electron gun of which only the cathode 1 and the accelerating anode 2 have been shown schematically, which generates and projects an electron beam 3 towards a collector 4 placed at the other end of the tube. A succession of cavity resonators is placed along the beam so as to interact with this beam through their respective electric fields. An input cavity 5, two intermediate cavities 6 and 7 and an output cavity 8 can be seen. The assembly is surrounded as far as possible by a magnetic winding 9 providing focusing of the beam. The number of intermediate cavities is variable, they may possibly be tuneable and their characteristics as well as those of the input and output cavities are determined by a man skilled in the art depending on the performances to be obtained. For construction thereof, reference may be made to conventional works on amplifying klystrons.

A coupling circuit having a terminal 10 feeds to the input cavity the signal to be amplified coming from an ultra-high frequency oscillator 11. The electric field of this input cavity 5 influences the electrons of the beam in the first interaction gap by modulating the speed of the electrons of this beam. Resonators 6 and 7 are excited by the modulated beam and react on the electron beam 3 while producing favorable grouping of the electrons in the interaction gap of the output resonator 8. The grouped electrons passing through the interaction gap of the output cavity 8 excite this cavity and the ultra high frequency power is extracted from this resonator by means of an output coupling circuit 12 which comprises, in the embodiment shown, an endpiece 13 forming a wave guide whose first end gives on to an opening 14 in the wall of cavity 8 and whose other end is sealed to the vacuum by a window 15 which is transparent to the ultra high frequency electro-magnetic radiation generated by the tube.

The above described assembly (except for oscillator 11) forms a power amplifying klystron, which is delivered by the manufacturer to the users while specifying well defined conditions of use and cooling. It is in fact clear, if we consider for example a power amplifying klystron intended to supply continuously an electromagnetic radiation of a power of 500 kilowatts at 500 MHz, that the cooling conditions must be particularly well complied with. It will more especially be advisable to cool the collector 4 which receives the electron beam. Cooling circuits are generally provided as well for the different cavities and in any case for the output cavity at the level of which there are greater chances that the electrons diverge and impact on the projections 16 of the interaction gap. So at least this output cavity is generally provided with a jacket 17 in which is provided a flow of cooling fluid, for example deionized water.

It is then up to the user to connect to this apparatus the device to which he desires to apply the ultra high frequency energy. For this, the user connects to end piece 13 wave guide 20 directing the energy of the klystron towards the load, for example a plasma which it is desired to heat. The user must also adapt the load so that no energy or only a very small amount of energy (less than 1% of the emitted energy) is fed back towards the klystron, that is to say that the ratio of standing waves in guide 20 must be substantially equal to 1. If the load to be energized is a fixed stable load, this condition may be fulfilled by suitably selecting guide 20, its coupling coefficient, its dimensions, etc. On the other hand, if the load has an impedance varying in time, which is for example the case in micro wave heating or plasma heating, the standing wave ratio may vary considerably. It may rise to values as high as 3/1 or even 4/1, with phase changes difficult to foresee. Consequently, in the prior art, when a power klystron is coupled across a load and when it is desired to cause this klystron to operate in its high efficiency zone, a circulator is disposed between the output wave guide 20 and the load.

A circulator is, as is well known, a device for deflecting the ultra high frequency energy reflected by a load so that it does not come back into its incident path. It is generally possible to manufacture a circulator giving satisfactory results and avoiding the return of energy to the emitting klystron. The disadvantage of such circulators resides essentially in their cost which becomes extremely high when the powers involved are high. Efforts are therefore made to do away with these circulators. As will be made clear hereafter, that can only be done conventionally at the price of using the klystron in a low efficiency zone.

FIG. 2 shows a graph characterizing the efficiency of a klystron. The value VC/VO of the normalized voltage at the level of the interaction gap of the output cavity is shown in abscissa, VC being the voltage at the terminals of this interaction gap and VO the acceleration voltage of the electron beam 3. The ordinates show the value IC/IO of the normalized current in the output cavity, IC being the current in this output cavity and IO the current of the electron beam. In such a graph, constant values of the IC.VC/IO.VO ratio characterize given efficiencies of the tube and correspond to hyperbolic shaped curves. In the Figure have been shown curves 30 to 35 characteristic of efficiencies going from 30% to 80%. Depending on the coupling of the output cavity, that is to say more especially on the dimensions of opening 14, for a given tube, the value of VC may be more or less large. Curves 40 and 41 show how IC varies as a function of VC, that is to say depending on the coupling of the output cavity for tubes having given characteristics. Curve 40 corresponds to a klystron with a low perveance and curve 41 to a klystron with higher perveance.

It can be seen that to increase the efficiency, it is desirable to increase the value of the voltage VC as much as possible. There exists however a limit for the maximum values of the peak voltages VC. This limit is reached when the peak voltage VC is substantially equal to the acceleration voltage VO of the beam. In fact, if VC becomes too much greater than VO, a part at least of the grouped electrons risks being braked excessively and sent back in the general direction of the cathode. These returning electrons will be generally defocused and will strike the internal walls of the klystron, particularly at the level of the projections of the output cavity which risk being heated considerably and even melting, which causes the destruction of the klystron tube. In the case of curves 40 and 41, there have been shown the respectively limits VC1 and VC2 of the maximum values of the voltage VC at the terminals of the interaction gap for avoiding this phenomenom.

If the load is perfectly matched to the klystron and if the energy reflected by this load is practically zero, the klystron may effectively operate in these zones of maximum efficiency, i.e. for the voltages VC1 and VC2 shown in FIG. 2. If now the klystron is used without a circulator across a variable load and if the energy reflected may for example be of the order of 10% of the emitted energy (standing wave ratio equal to 2), this results in the appearance of a voltage V′C which is superimposed on the voltage VC at the terminals of the interaction space, V′C being of the order of 30% of VC. The resulting voltage then risks exceeding the tolerable limit and leading to destruction of the tube. If the variations of the load impedance have a random character, the tube can only be protected by permanent operation under low excitation, leading to low efficiency in all circumstances.

SUMMARY OF THE INVENTION

One object of the present invention is to overcome this drawback and to provide a klystron able to operate across a variable load under conditions of optimum efficiency.

To attain this object as well as others, the present invention provides an amplifying klystron for heating a variable load comprising, in its output cavity a probe for detecting the field in this cavity. The signal delivered by this probe is used for adjusting the amplitude of the ultra-high frequency signal applied to the input cavity.

BRIEF DESCRIPTION OF THE DRAWINGS

These objects, characteristics and advantages as well as others of the present invention will be described in greater detail in the following description of a particular embodiment with reference to the accompanying Figures in which.

DESCRIPTION OF THE PREFERRED EMBODIMENT

Figure 2:
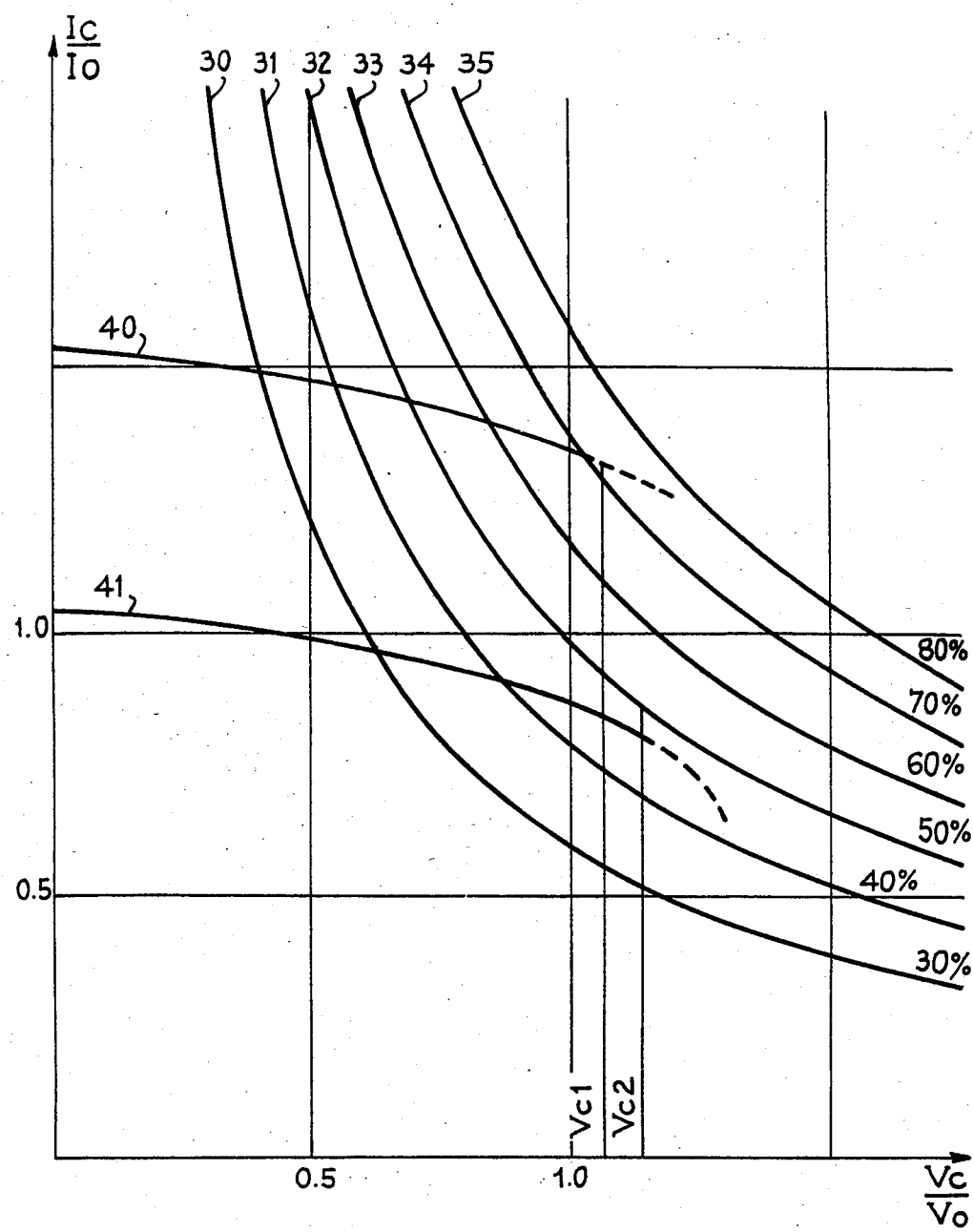

The present invention follows from a careful study of the operation of a klystron across a variable load and from a detailed analysis of the operating curves of the type shown in FIG. 2, which analysis has already been outlined above.

Conventionally, studies concerning the operation and the output coupling of a klystron were essentially based on explanations associated with the ratio of standing waves appearing in the output wave guide and without analysing in a detailed fashion what happens inside the output cavity. We have seen that a standing wave ratio corresponded to the appearance of a parasite voltage V′C at the terminals of the interaction space which is superimposed on the voltage VC which would exist in the absence of reflected waves but, especially in the application to the heating of a plasma in machines of the "Tokamak" type, numerous uncertainties exist concerning this voltage V′C. First of all, its phase is variable and non determined; furthermore, even its amplitude cannot be calculated beforehand for tests made at reduced power would in no wise represent the phenomena occuring at full power when the plasma is very much heated. In view of this ignorance of the conditions in which the klystron will effectively operate, we are lead, as was seen before, to reduce the efficiency but even so it is reduced much more than necessary since we do not know exactly what the operating conditions will be and since we are forced to provide a considerable margin of safety.

To avoid this disadvantage and to extract from the tube under all circumstances the highest power compatible with the impedance presented by the load, the invention proposes limiting the voltage reigning between the projections of the output cavity to the value which prevails when the tube is operating optimally across a matched load.

For this, the invention provides for effecting an indirect measurement of the voltage at the terminals of the interaction gap of the output cavity and using the result of this measurement for controlling the power injected by the oscillator 11 into the input cavity 5 of the klystron so that the voltage at the terminals at the interaction gap remains constant and equal to the optimum value VC1 or VC2.

Figure 1:
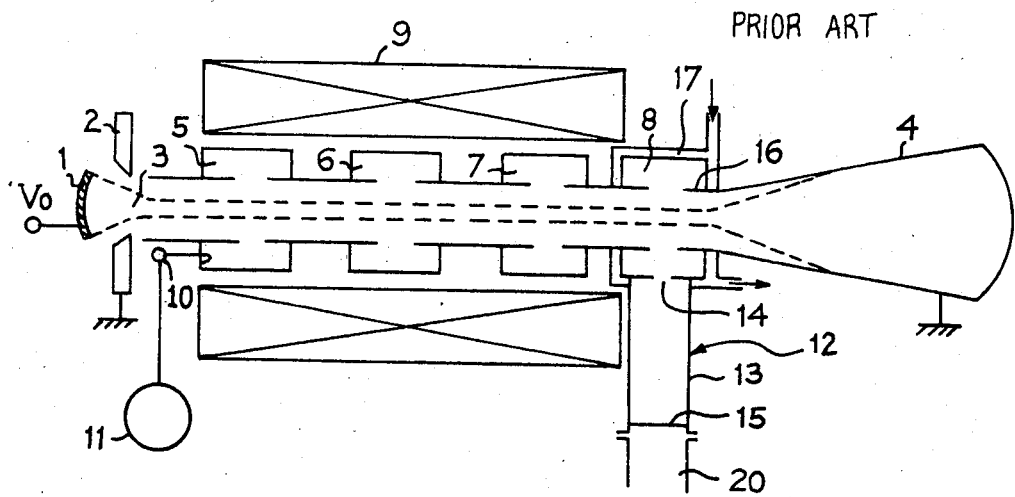
FIGS. 1 and 2, for illustrating the state of the technique and setting forth the problem which the invention seeks to resolve, have already been described.
Figure 3:
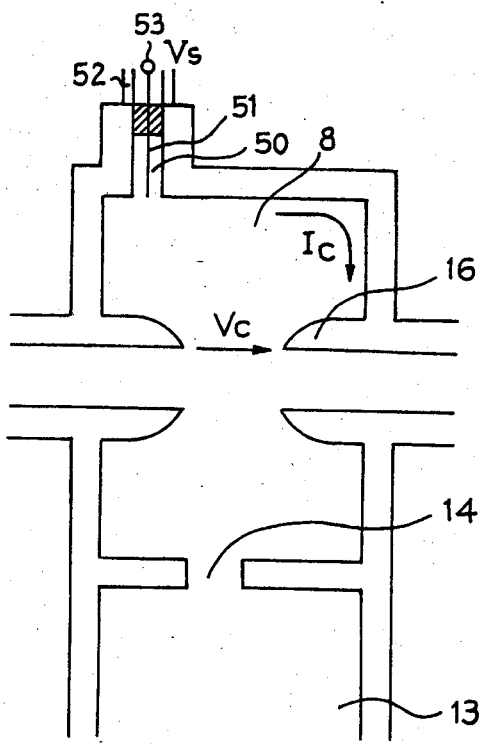
FIG. 3 shows schematically the output cavity of a klystron in accordance with the present invention.

For evaluating the voltage at the terminals at the interaction gap, the invention proposes using a probe disposed in the wall of the output cavity, providing for a given natural resonance mode an indication proportional to the desired voltage. This complicates the manufacture of the klystron since, as shown in FIG. 3, which reproduces a little less schematically, the drawing of the output cavity with the same references as in FIG. 1, it is necessary to provide an opening 50 in this output cavity for sliding the probe. This probe may be formed by the core 51 of a coaxial cable 52 or any other equivalent means such as a loop 54. Providing an opening in the output cavity is particularly delicate since, as was seen above, this output cavity is generally enclosed in a jacket filled with water. Nevertheless, this complication in the manufacture of the klystron will generally result in an increase in cost much less than the cost of a circulator. The output signal VS of the probe of the invention is available at terminal 53.

Figure 4:
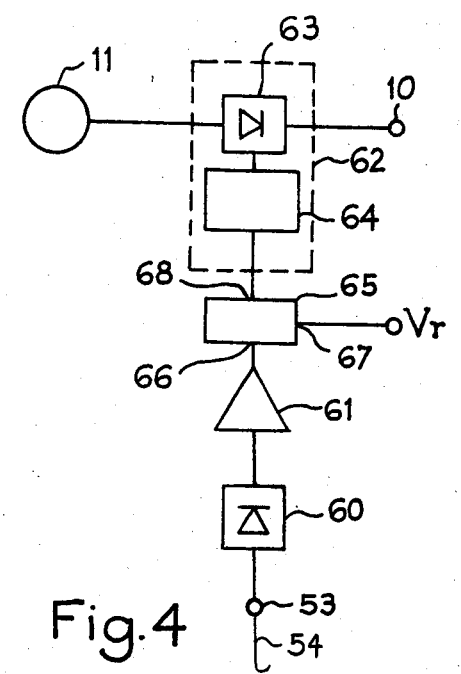
FIG. 4 shows in block form a circuit adapted to a klystron in accordance with the invention.

FIG. 4 shows by way of example how this signal VS may be used for modifying the level of the input signal received from oscillator 11 by terminal 10 of the coupler of the input cavity. This signal at terminal 53 is a first of all rectified by a detector 60, for example a diode, then is amplified by a DC amplifier 61 for application to an attenuator 62 adjustable by the DC output voltage of amplifier 61, this attenuator being inserted between oscillator 11 and terminal 10. The adjustable attenuator comprises for example a PIN diode 63 whose transmission depends on the DC bias voltage which is applied thereto, this bias voltage being supplied by a modulator 64 responding to the signal given by amplifier 61.

In addition, a comparator device 65, having three terminals 66, 67 and 68 is inserted between the amplifier 61 and attenuator 62. Device 65 receives at its terminal 66 the DC voltage from amplifier 61 and restores it at its terminal 68 providing that said voltage is greater than the reference voltage Vr applied to its terminal 67; if said voltage is on the contrary less than Vr, no signal appears at terminal 68 and attenuator 62 is inoperative.

The reference voltage Vr is determined by causing the klystron to operate across a matched load under optimum conditions; the value to be chosen for Vr is the value of the voltage then present at terminals 66.

It should be emphasised that one of the fundamental aspects of the present invention resides in the application of the idea according to which the fundamental parameter for ensuring optimum operation of a power klystron across a variable load is the voltage effectively present at the terminals of the interaction gap of the output cavity and not the rate of standing waves in the output coupler of this cavity (generally a wave guide). This is all the more true if the output cavity of the klystron comprises several outputs, and not just a single one as has been described and shown above. In this case, the rates of standing waves present in these different outputs may be different and the energy effectively fed back to the klystron and the resulting modification of the voltage at the terminals of the interaction gap could not be inferred from the measurement of one or other of these standing wave rates.

The present invention is not limited to the embodiments which have been explicitly described; numerous variations thereof may be devised by a man skilled in the art taking into account the knowledge acquired at the time of the present application.

What is claimed is:

1. A power amplifying klystron for supplying a variable load, comprising an electron gun, a collector, and between said electron gun and said collector a succession of cavity resonators with at least an input cavity means for receiving an ultra-high frequency signal to be amplified and an output cavity with an interaction gap, a probe disposed in the output cavity for detecting a signal Vs proportional to the voltage Vc at the level of the interaction gap of the output cavity and means provided between the probe and the input cavity, using the signal Vs for adjusting the amplitude of the ultra-high frequency signal so that the voltage Vc at the level of the interaction gap is at the optimum value Vc1 or Vc2.

2. The klystron as claimed in claim 1, wherein said detection probe is formed by the core of a coaxial line inserted in an opening on a level with the inner surface of the cavity.

3. The klystron as claimed in claim 1, wherein said detection probe is formed by an electromagnetic coupling loop.

4. The klystron as claimed in claim 1, wherein the means provided between the probe and the input cavity means comprises a variable attenuator inserted between the input cavity means and an ultra-high frequency signal source and includes in series with the probe a detector, an amplifier and a comparator.

5. The klystron as claimed in claim 4, wherein said variable attenuator comprises a PIN diode and a modulator modifying the bias of this diode.

* * * * *